United States Patent [19]

Oya et al.

[11] 3,803,513

[45] Apr. 9, 1974

[54] SOLID STATE OSCILLATOR

[76] Inventors: Toshio Oya, No. 355 Mizonokuchi, Takatsu-ku, Kawasaki; Yukio Ito, No. 1-20-203, 27 Fujimidai 1-chome, Kunitachi-shi, Tokyo; Hidemitsu Komizo, No. 2-5-15 Miyamaedaira, Takatsu-ku, Kawasaki; Fumio Mita, No. 805 Kigetsu, Nakahara-ku, Kawasaki, all of Japan

[22] Filed: Nov. 29, 1972

[21] Appl. No.: 310,474

[30] Foreign Application Priority Data

Nov. 29, 1971 Japan ................................ 46-96081

[52] U.S. Cl. .................. 331/96, 331/107 R, 333/11

[51] Int. Cl. ............................................ H03b 5/18

[58] Field of Search ................ 333/11; 331/96, 107

[56] References Cited

UNITED STATES PATENTS 3,602,841 8/1971 McGroddy...................... 331/107 G

*Primary Examiner*—John Kominski

*Attorney, Agent, or Firm*—Staas, Halsey & Gable

[57] ABSTRACT

A microwave solid state oscillator in which a hybrid circuit having connected thereto a plurality of resonators with different resonance frequencies and a matched dummy load is coupled to a solid state oscillating element and the oscillation region is wide and stable and the oscillation output characteristic to a temperature change is flat.

9 Claims, 15 Drawing Figures

SOLID STATE OSCILLATOR

BACKGROUND OF THE INVENTION

1. Field of the Invention

This invention relates to a solid state oscillator, and more particularly to a microwave solid state oscillator whose oscillation region is wide and stable and whose oscillation output characteristic to a temperature change is flat.

2. Description of the Prior Art

Hitherto, various types of oscillators employing a solid state oscillating element such as a Gunn diode, an Impatt diode or the like have been developed in which the solid state oscillating element and a cavity resonator are combined with each other.

However, these conventional solid state oscillators utilize the coupling of a single resonator at a particular resonant frequency with the solid state oscillating element and they are designed to stabilize the oscillation frequency chiefly by enhancing Q of the resonator, and hence they have a tendency that the oscillation region becomes inevitably narrow as a result of the enhancement of Q of the resonator.

Some of the prior solid state oscillators are likely to present a hysteresis phenomenon in the relation of the oscillation frequency $f_{osc}$ to the resonance frequency $f_c$ of the resonator to cause a mode jump by a change in surrounding conditions and the other remaining ones have defects such as a narrow frequency range for stable oscillation and susceptibility to the influence of a change in the ambient temperature.

SUMMARY OF THE INVENTION

One object of this invention is to provide a solid state oscillator with a wide oscillation region which is free from the aforementioned defects experienced in the prior art.

Another object of this invention is to provide a solid state oscillator in which the temperature dependency of a solid state oscillating element is compensated for by an external resonance circuit to prevent the oscillation output characteristic from being affected by temperature.

In accordance with these and other objects of this invention, there is provided a solid state oscillator in which a hybrid circuit having connected thereto resonators of different resonance frequencies and a matched dummy load is coupled to a solid state oscillating element, thereby to make the oscillation region wide and stable and avoid the influence of a temperature change.

Other objects, features and advantages of this invention will become apparent from the following description taken in conjunction with the accompanying drawings.

DESCRIPTION OF THE PREFERRED EMBODIMENTS

Figure 1:
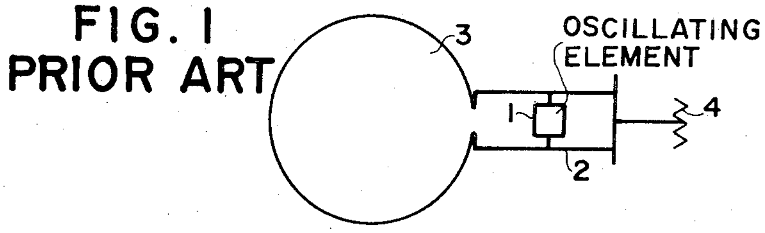
FIG. 1 PRIOR ART
FIG. 1 schematically illustrates one example of a known solid state oscillator.
Figure 2:
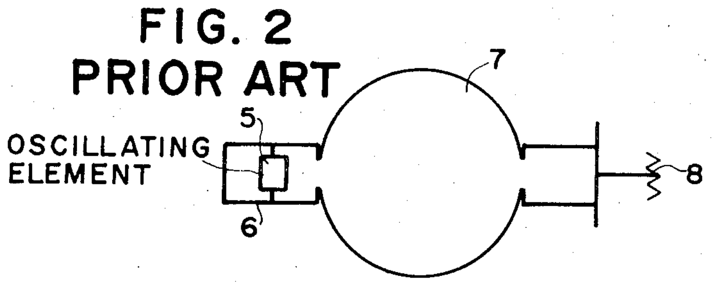
FIG. 2 PRIOR ART
FIG. 2 schematically shows another example of the known solid state oscillator.

In general, the microwave solid state oscillator of the type using a Gunn diode, the Impatt diode or like solid state oscillating element employs the combination of a resonance circuit with the solid state oscillating element. FIG. 1 shows a reflection-type highly stable oscillator, in which a solid state oscillating element 1 is mounted on a waveguide 2 and a resonator 3 of high Q is added and which supplies an oscillation output to a load 4. FIG. 2 illustrates a transmission-type, highly stable oscillator, in which a solid state oscillating element 5 is mounted in a waveguide 6 and a resonator 7 of high Q is connected between the oscillating element 5 and a load 8.

The circuit construction depicted in FIG. 1 is disclosed, for example, in IEEE Trans, Microwave Theory Tech. vol. MTT-18, pp 890 to 897, Nov. 1970 and that of FIG. 2 is set forth in IEEE Trans. Microwave Theory Tech. vol. MTT-16, No. 9, pp 743 to 748, Sept. 1968.

In these conventional oscillators of FIGS. 1 and 2, there is a region in which a hysteresis phenomenon occurs in the relation of the oscillation frequency $f_{osc}$ to the resonance frequency of the resonators 3 and 7 and two stable oscillation points exist, which introduces the possibility of causing a mode jump by a change in the external conditions.

Figure 3:
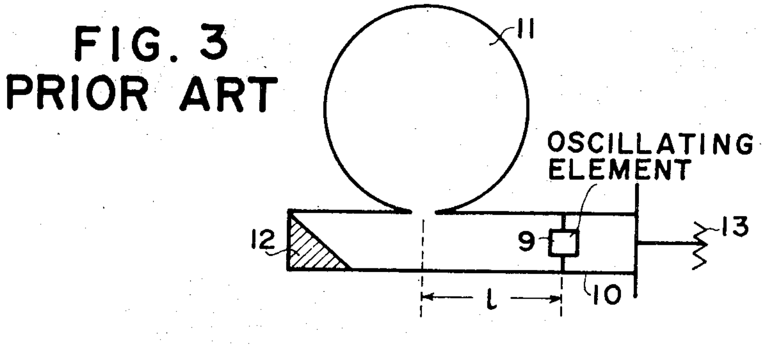
FIG. 3 PRIOR ART
FIG. 3 similarly shows another example of the known solid state oscillator.

FIG. 3 similarly shows another example of the known oscillator in which a solid state oscillating element 9 is mounted in a waveguide 10 and a resonator 11 is connected at a position spaced a distance $l$ from the solid state oscillating element 9 and in which frequency components outside of a predetermined oscillation band are absorbed by a non-reflecting resistive terminator 12 and the oscillation output inside of the band is fed to a load 13.

This circuit construction is disclosed, for example, in Proc. of the IEEE, pp 1532 to 1533, Oct. 1971. With this construction, stable oscillation can be obtained by absorbing the frequency components outside of the oscillation band with the resistive terminator 12 but this circuit construction has a defect that if Q of the single resonator 11 used is enhanced, the oscillation region becomes inevitably narrowed. Namely, a locus G of the total load admittance versus frequency viewed from the terminals of the solid state oscillating element becomes as indicated by a broken line on the Smith chart of FIG. 6. At a point F on the locus G conditions for oscillation are satisfied to cause oscillation but the frequency range for stable oscillation is narrow and susceptible to the influence of ambient temperature change, so that the stable oscillation frequency range is narrow.

This invention is novel and free from the aforesaid defects encountered in the prior art and has for its object to stabilize the operation and widen the operating frequency range.

The solid state oscillator of this invention is characterized in that a hybrid circuit having connected thereto resonators having the different resonance frequencies and a stabilizing resistor is coupled with the solid state oscillating elements. This invention will hereinafter be described in detail in connection with its examples.

Figure 4:
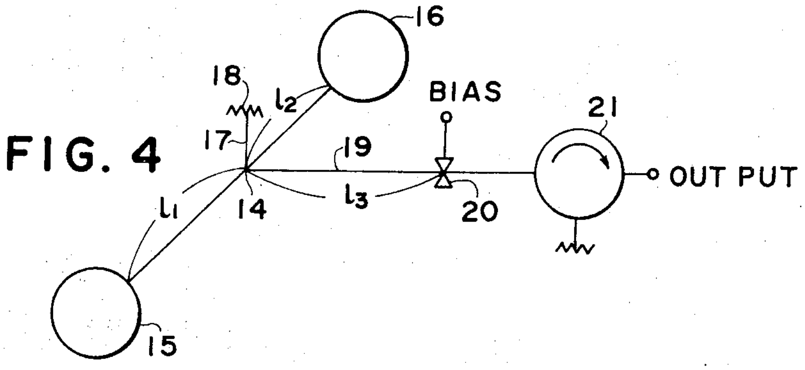
FIG. 4 is a schematic diagram for explaining the construction of one example of a solid state oscillator produced according to this invention.
Figure 5:
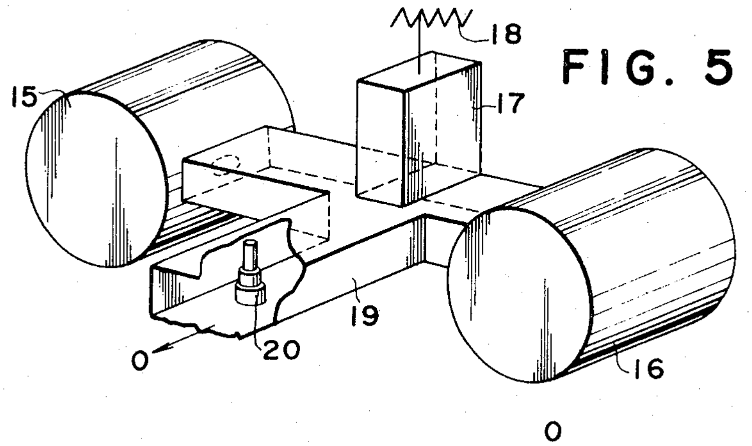
FIG. 5 is a perspective view of the solid state oscillator of the construction depicted in FIG. 4.

FIG. 4 is a schematic diagram for explaining the principles of this invention and FIG. 5 is a perspective view, partly cut away, of the construction shown in FIG. 4, in which a magic T is used as the hybrid circuit. Cavity resonators 15 and 16 are connected to both arms of the magic T at positions spaced distances $l_1$ and $l_2$ from its center, the E-branch 17 of the magic T is terminated with a non-reflecting resistive terminator 18, that is, a stabilizing resistor and a solid state oscillating element 20 is mounted on an H-branch 19 at a point spaced a distance $l_3$ from the center of the magic T. The resonance frequencies $f_{C1}$ and $f_{C2}$ of the cavity resonators 15 and 16 are selected a little different from each other and the distances $l_1$ and $l_2$ are selected such that the difference therebetween may be $\lambda g/4$ or an odd number of times as long as it, where λg is a guide wavelength. Further, an isolator 21 is provided on the output side of the solid state oscillating element 20 for preventing an influence from the output side.

At frequencies well apart from the resonance frequencies $f_{C1}$ and $f_{C2}$, waves having reached the cavity resonators 15 and 16 from the H-branch 19 are regarded as short-circuited at the cavity resonators 15 and 16, and consequently they are reflected back in in-phase relation respectively. However, since the distances $l_1$ and $l_2$ are different by $\lambda g/4$ from each other, the difference therebetween in both ways is $\lambda g/2$, so that the waves reflected respectively back to the center of the magic T are consequently returned in opposite phases and are absorbed by the resistive terminator 18 at the tip of the E-branch 17. Where the oscillation frequency component coincides with either of the resonance frequencies $f_{C1}$ and $f_{C2}$ of the cavity resonators 15 and 16, the cavity resonator whose resonance frequency is coincident with the oscillation frequency component is regarded as open, so that the wave having reached it is returned in opposite phase to that on its way to the resonator, but the wave from the other cavity resonator is returned in the same phase. Since the difference between the distances $l_1$ and $l_2$ is $\lambda g/4$, the waves reflected respectively back to the center of the magic T are consequently returned in in-phase relation, and consequently it goes to the H-branch 10. Namely, the resonance characteristic due to the resonators 15 and 16 becomes a double-humped characteristic having crests at the resonance frequencies $f_{C1}$ and $f_{C2}$, thus making it possible to take out only an output in the corresponding frequency range. This widens the frequency range for stable oscillation and enables stable oscillation and, at the same time, enhancement of Q of the cavity resonators 15 and 16.

Figures 6, 7:
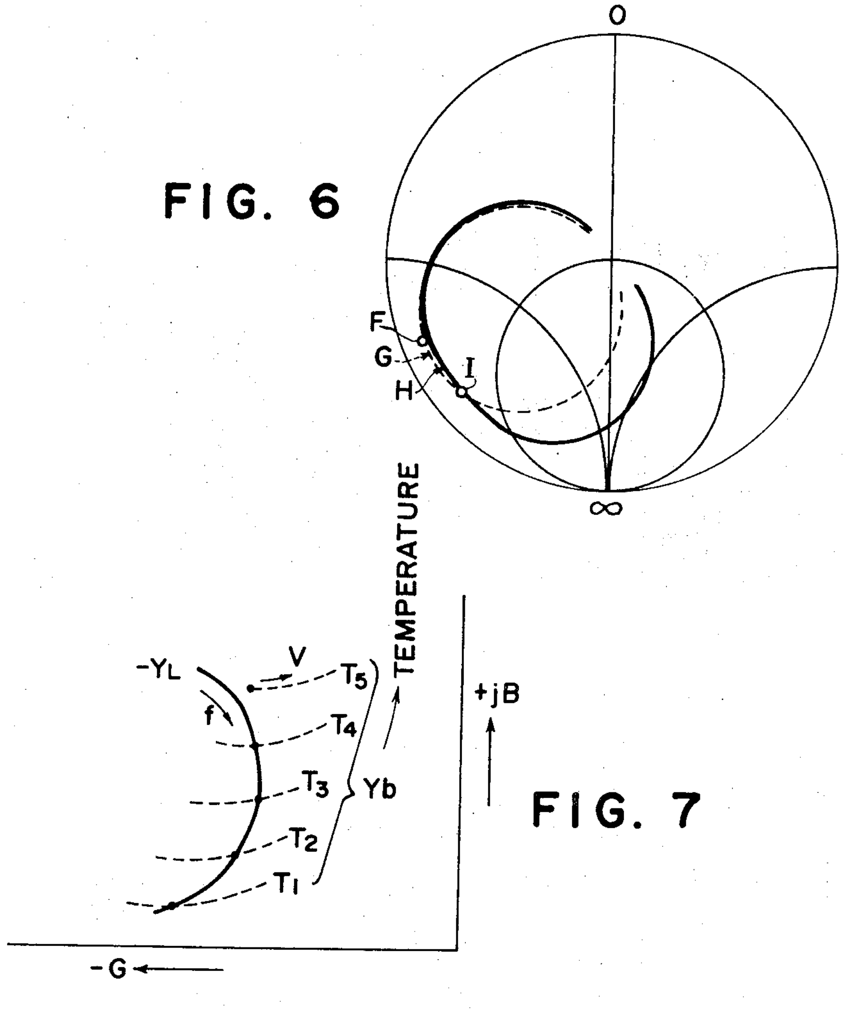
FIG. 6 shows one example of a frequency locus of the load admittance of each of the oscillators illustrated in FIGS. 3 and 4.
FIGS. 7 and 8 are graphs for explaining the temperature dependency of the oscillator.

FIG. 6 shows this relation in comparison with that in the example of FIG. 3, illustrating the frequency locus of the load admittance viewed from the both ends of the solid state oscillating element. In the examples of FIGS. 4 and 5, the conditions for oscillation are satisfied with the electronic admittance of the solid state oscillating element 20 and the frequency locus H on the side of the load and oscillation is caused at a point I.

As is apparent from the figure, the range running in parallel with the outer circle increases in the neighborhood of the point I and the stable oscillation range is wide and stable oscillation can be achieved even if the distance $l_3$ changes.

Further, by appropriate combination of Q's of the cavity resonators 15 and 16 in the absence and presence of a load with the resonance frequencies $f_{Cl}$ and $f_{C2}$, the total Q can be made at a desired value and it is also possible to compensate for the temperature dependency of the solid state oscillating element admittance.

Referring now to FIGS. 7 to 13, a description will hereinbelow be given of compensation for the temperature dependency of the solid state oscillating element admittance.

In general, the condition for oscillation in an oscillator using a negative resistance element is given by $$\dot{Y}_D = -\dot{Y}_l$$

where $\dot{Y}_D$ and $\dot{Y}_L$ are the admittance of the negative resistance element and that of an external resonance circuit respectively. The admittance $\dot{Y}_D$ of the negative resistance element is a function of a high frequency voltage V applied to the element, and a frequency $f$ and the admittance $\dot{Y}_L$ of the external resonance circuit is a function of Q and the frequency $f$. Showing the admittance $\dot{Y}_D$ to the high-frequency voltage V and that $\dot{Y}_L$ to the frequency $f$ on the admittance chart with the latter admittance being represent as $-\dot{Y}_L$, the high-frequency voltage V and the frequency $f$ at the time of steady oscillation can be obtained from the intersecting point of the curves.

Further, an oscillation output power P is given by $$P = 1/2|G|V^2$$

from the conductance $G$ and the oscillating high-frequency voltage $V$ at the aforementioned intersecting point. However, an increase in the voltage $V$ causes a decrease in the absolute value $|G_D|$ of the conductance $G_D$ of the element and the voltage $V$ providing a maximum output $P$max at a certain temperature exists. Further, the external resonance circuit can be designed by selecting the materials or the like of its components so that even if the ambient temperature changes, the admittance $\dot{Y}_L$ may remain substantially unchanged but the admittance $\dot{Y}_D$ of the element remarkedly changes in response to the temperature change. Accordingly, the maximum output Pmax changes with temperature and exhibits a tendency to increase at low temperatures and decrease at high temperatures.

The admittance of an oscillator employing a single resonance circuit combined with a conventional stabilizing resistor is, for example, such as shown in FIG. 7, in which an arrow "$f$" indicates the direction in which the frequency increases. The admittance $\dot{Y}_D$ of the element and that $\dot{Y}_L$ of the resonance circuit are expressed by $$\dot{Y}_D = -G_D + jB_D$$

$$\dot{Y}_L = G_L - jB_L$$

In general, as temperature rises to $T_1, T_2, \ldots T_5$, the absolute value $|G_D|$ of the element decreases and the absolute value $|B_D|$ of the susceptance increases.

However, at frequencies below the resonance frequency of the resonance circuit, the absolute value $G_L$ 9 of the conductance increases in case of which the absolute value $|B_L|$ of the susceptance increases, so that the oscillation region extends up to a maximum value *T*max of the ambient temperature.

Figures 8, 9:
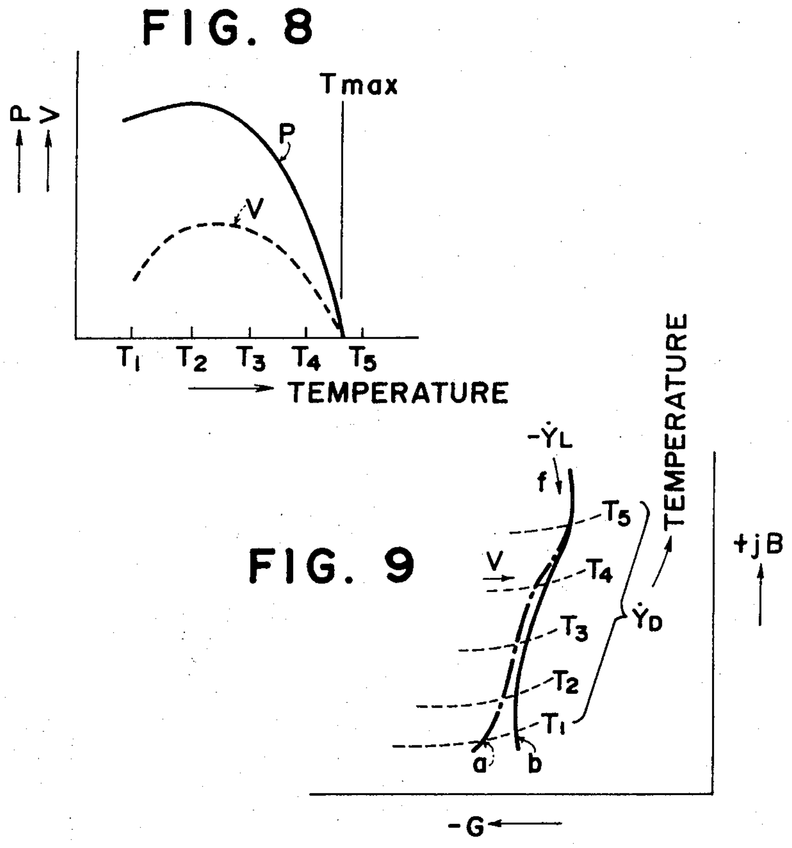
FIGS. 9 to 13, inclusive, are diagrams for explaining temperature characteristics obtainable with this invention.

FIG. 8 shows the temperature characteristics of the output *P* and the high-frequency voltage *V*, in which the output *P* and the high-frequency voltage *V* become zero at the maximum ambient temperature *T*max and there is a temperature at which they become maximum.

Hitherto, it has been considered to raise Q of the external resonance circuit for decreasing a change in the frequency *f* due to temperature change. Namely, it has been the practice to reduce the frequency change resulting from a change in the susceptance. Accordingly, substantially no change has been caused in the frequency but the high-frequency voltage *V* and the output *P* have been changed with temperature change.

Figure 10:
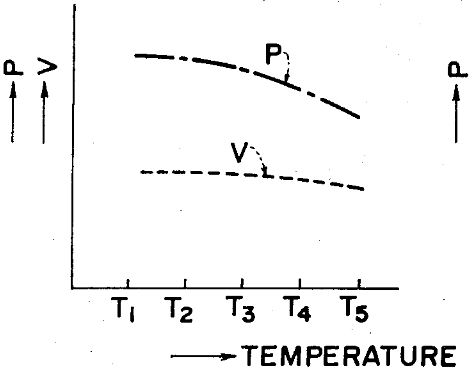
Figure 11:
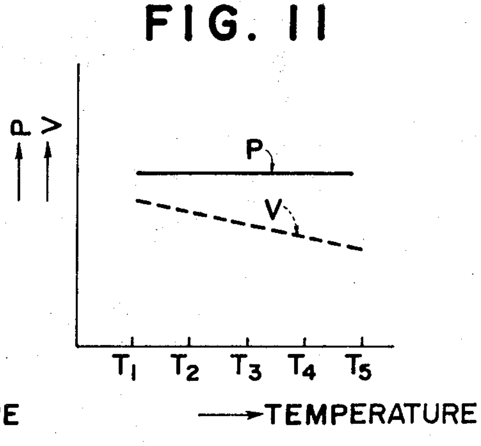

FIG. 9 is an admittance chart of another example of the solid state oscillator of this invention, corresponding to that of FIG. 7. The admittance $\dot{Y}_L$ of the resonator is altered to provide a maximum output corresponding to a change in the admittance $\dot{Y}_D$ of the element with temperature. Namely, this example is adapted so that the composite admittance $\dot{Y}_L$ of the resonators 15 and 16 shown in FIG. 4 is provided with a frequency characteristic. For example, in the case of the characteristic indicated by a curve *a*, the oscillation voltage *V* can be made substantially constant as depicted in FIG. 10 and in the case of the characteristic of a curve *b*, the oscillation output power P can be made substantially constant as shown in FIG. 11.

Figure 12:
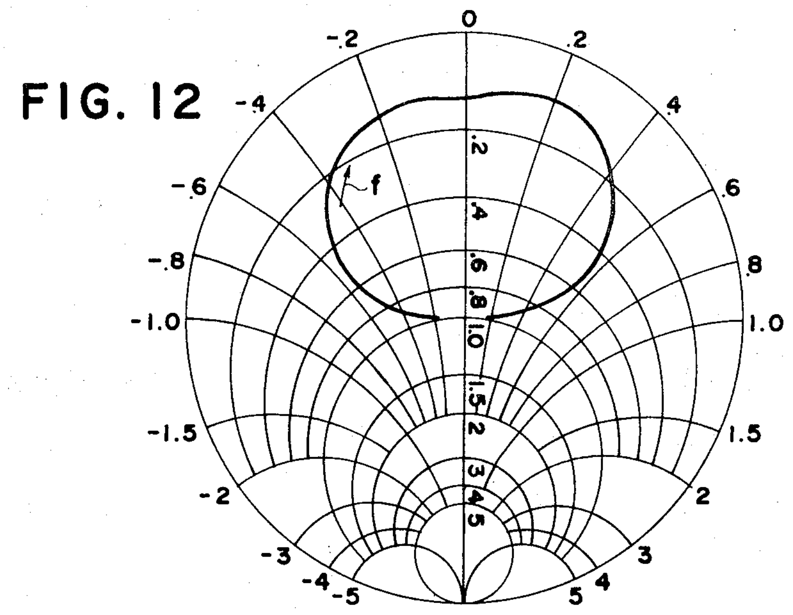
Figure 13:
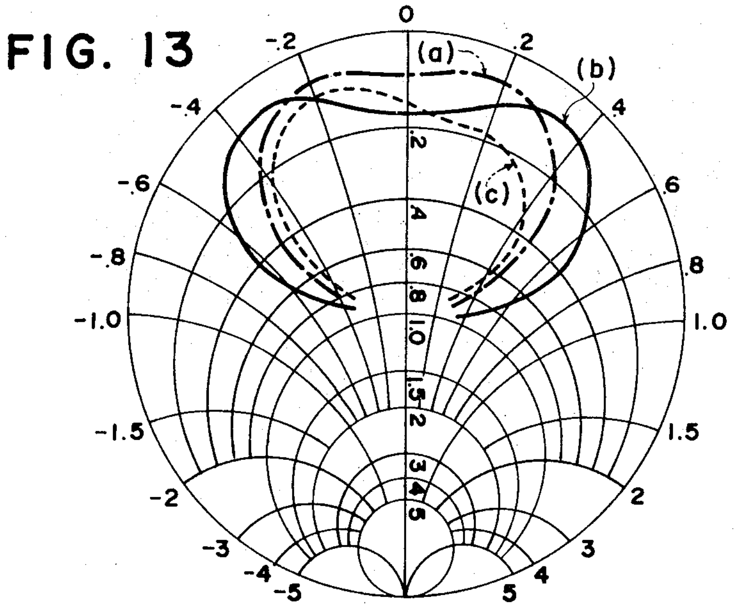

The admittance of the load resonance circuit viewed from the center of the magic T shown in FIG. 4 becomes as depicted in FIG. 12. By the combination of various unloaded Q(Qo), load Q(QL) and the difference Δbetween the resonance frequencies $f_{C1}$ and $f_{C2}$ of each of the cavities, the locus of the admittance $\dot{Y}_L$ of the load resonance circuit can be made a desired characteristic as indicated by (*a*), (*b*) and (*c*) in FIG. 13. In this case, if the frequency difference Δf is increased with Qo and QL values being held constant, the admittance locus changes from (*a*) to (*b*) and if Q's of the cavity resonators 15 and 16 in the absence and presence of a load is made different from each other by the both resonators with the frequency difference Δf being held constant, the locus becomes laterally asymmetrical as indicated by (*c*). Further, where the distance $l_3$ between the center of the magic T and the solid state oscillating element 20 is altered, the intersecting point with the admittance $\dot{Y}_D$ can be controlled. Accordingly, if Q's of the cavity resonators 15 and 16 are selected sufficiently high and if the locus of the admittance $\dot{Y}_l$ is properly adjusted, it is possible to realize an oscillator which is stable both in the oscillation frequency and in the oscillation output in response to a temperature change over a wide range.

The foregoing description has been given of the oscillator of FIG. 4 employing the magic T type hybrid circuit but the same results can be obtained with the use of other known hybrid circuits.

Figure 14:
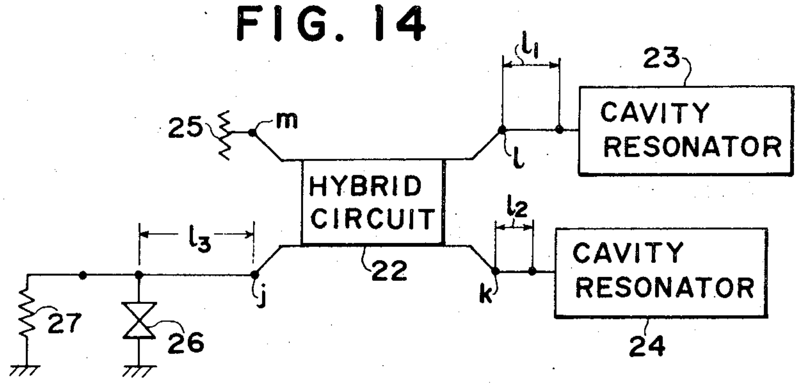
FIGS. 14 and 15 are diagrams for explaining the construction of another example of this invention.
Figure 15:
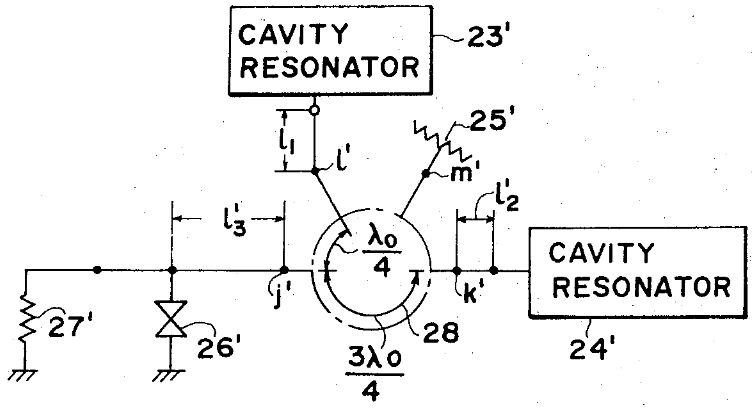

FIG. 14 illustrates another example of this invention which employs a 90°·3dB hybrid circuit and FIG. 15 another example using a 180° hybrid (Rat Race) circuit.

In the example of FIG. 14, a wave entering from a terminal *j* of the 90°·3dB hybrid circuit 22 is transmitted to terminals *l* and *k* with electric power while being displaced 90° apart in phase. To the terminals *l* and *k* are connected cavity resonators 23 and 24 of high Q and having resonance frequencies $f_{C1}$ and $f_{C2}$ respectively and the difference in length between the lines, that is, $l_1 - l_2$ is selected to be λo/4 or an odd number of times as long as it.

Therefore, as described previously with regard to FIG. 4, in the neighborhood of the frequency $(f_{C1} + f_{C2})/2 = f_O$, the input wave from the terminal *j* is reflected by the resonators 23 and 24 and composed in phase and returned as if totally reflected. On the other hand, if an input of a frequency far apart from the both resonance frequencies appears at a terminal *m*, it is absorbed by a resistive terminating resistor 25. Accordingly, if an oscillating element 26 is provided at a position spaced an appropriate distance $l_3$ from the terminal *j* and if a load resistor 27 is appropriately selected to satisfy the condition for oscillation, it is possible to achieve stable oscillation which is determined by Q of the cavity resonators and the difference between the resonance frequencies of the both resonators $\Delta f = f_{Cl} - f_{C2}$. Then, it is also possible to compensate for the temperature dependency of the oscillating element 26 as described previously in connection with FIGS. 9 to 13.

Also in the case where the 180° hybrid circuit 28 depicted in FIG. 15 is employed, the oscillator can be operated in exactly the same manner as in the example of FIG 4 or 14.

As has been described in the foregoing, in the present invention a plurality of cavity resonators of a little different resonance frequencies are employed, so that their composite characteristic becomes equal to that in the case of a resonance circuit of stagger connection and the composite Q can be highly enhanced and the frequency for stable oscillation can be widened.

Further, since the unwanted waves are led to the resistive terminating resistor by appropriate selection of the distances $l_1$ and $l_2$ to the cavity resonators, there is no region in which a hysteresis phenomenon occurs in the relation between the resonance frequencies of the resonators and the oscillation frequency.

Moreover, by appropriate selection of Qo and QL of the resonators, the resonance frequencies $f_{Cl}, f_{C2}, \ldots$ and the distance $l_3$, the temperature dependency of the solid state oscillating element admittance can be compensated and, further, the whole temperature characteristic can be made as desired.

Numerous changes may be made in the above described apparatus and different embodiments of the invention may be made without departing from the spirit thereof; therefore, it is intended that all matter contained in the foregoing description and in the accompanying drawings shall be interpreted as illustrative and not in a limiting sense.

What is claimed is:

1. Oscillator apparatus for providing a stable output over an extended frequency range, comprising:

first and second resonator means, respectively of first and second resonant frequencies, said first resonant frequency differing from said second resonant frequency;

non-reflecting terminator means;

oscillating means; and hybrid circuit means for interconnecting said oscillating means to said non-reflecting terminator means and to said first and second resonator means respectively along first and second lines of said hybrid circuit, said first and second lines having respectively first and second lengths, the difference between said first and second lengths determined such that undesirable waves are substantially absorbed by said terminator means and waves having frequencies between the first and second resonant frequencies are added in-phase by said hybrid circuit means to provide extended frequency output.

2. Oscillator apparatus as claimed in claim 1, wherein the difference between said first and second lengths is $nL/4$, where $L$ is the line wavelength and $n$ is an odd integral number.

3. Oscillator apparatus as claimed in claim 1, wherein said first and second resonator means have, respectively, first and second Q's in the absence and in the presence of a load selected in response to the temperature dependency of said oscillating means, whereby the output characteristic of said oscillator apparatus in response to temperature change is selectively determined.

4. Oscillator apparatus according to claim 1, wherein said hybrid circuit means comprises a magic T-type hybrid circuit.

5. Oscillator apparatus according to claim 1, wherein said hybrid circuit means comprises a 90°· 3dB hybrid circuit.

6. Oscillator apparatus according to claim 1, wherein said hybrid circuit means comprises a 180° hybrid circuit.

7. Oscillator apparatus according to claim 1, wherein there is further included isolator means coupled to the output of said oscillating means for isolating said oscillator apparatus from external influences.

8. Oscillator apparatus as claimed in claim 1, wherein the distance between said oscillating means and said hybrid circuit means is determined selectively to control the admittance of said oscillating means, whereby the stability of the oscillator apparatus output is improved.

9. Oscillator apparatus as claimed in claim 1, wherein said hybrid circuit means is connected to said terminator means to apply unwanted waves to said terminator means.

* * * * *